US012813266B2

(12) United States Patent
He et al.

(10) Patent No.: US 12,813,266 B2
(45) Date of Patent: Nov. 24, 2026

(54) HEAT CONDUCTOR, HEAT-CONDUCTING MATERIAL, AND PACKAGE STRUCTURE OF SEMICONDUCTOR DEVICE

(71) Applicant: Huawei Technologies Co., Ltd., Shenzhen (CN)

(72) Inventors: Ran He, Shenzhen (CN); Ronghua Xie, Dongguan (CN); Kunhui Xiao, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 424 days.

(21) Appl. No.: 17/702,551

(22) Filed: Mar. 23, 2022

(65) Prior Publication Data

US 2022/0216124 A1 Jul. 7, 2022

Related U.S. Application Data

(63) Continuation of application No. PCT/CN2020/116359, filed on Sep. 21, 2020.

(30) Foreign Application Priority Data

Sep. 24, 2019 (CN) ........................ 201910906873.1

(51) Int. Cl.
*C09K 5/14* (2006.01)
*C08K 9/02* (2006.01)
(Continued)

(52) U.S. Cl.
CPC ............ *H10W 40/257* (2026.01); *C08K 9/02* (2013.01); *C09K 5/14* (2013.01);
(Continued)

(58) Field of Classification Search
CPC ... H01L 2224/8384; H01L 2224/83862; H01L 23/3737; H01L 23/3733
See application file for complete search history.

(56) References Cited

U.S. PATENT DOCUMENTS 8,900,704 B1 12/2014 Zinn
2005/0139999 A1* 6/2005 Narendra ............. H01L 23/367
257/E23.079

(Continued)

FOREIGN PATENT DOCUMENTS

CN 1875480 A 12/2006
CN 1982404 A 6/2007

(Continued)

OTHER PUBLICATIONS

S. Wei et al., Investigation on enhancing the thermal conductance of gallium-based thermal interface materials using chromium-coated diamond particles, Journal of Materials Science: Materials in Electronics (2019) 30:7194 7202, total 9 pages.

(Continued)

*Primary Examiner* — Kretelia Graham
*Assistant Examiner* — David J Goodwin
(74) *Attorney, Agent, or Firm* — WOMBLE BOND DICKINSON (US) LLP

(57) ABSTRACT

This application provides a heat conductor with a large coefficient of thermal conductivity, which can be used to dissipate heat for a semiconductor device, and in particular, may be used in the semiconductor device package field. The heat conductor includes a matrix, and a diamond particle and a first metal nanoparticle that are distributed in the matrix, and an outer surface of the diamond particle successively includes a carbide film layer, a first metal film layer, and a second metal film layer. The three film layers are used to reduce interface thermal resistance between the diamond particle and the first metal nanoparticle. In addition, this application further provides a fluid heat-conducting material and a semiconductor package structure that uses the foregoing heat conductor.

20 Claims, 2 Drawing Sheets

(51) Int. Cl.
*H01L 23/373* (2006.01)
*H10W 40/25* (2026.01)

(52) U.S. Cl.
CPC .. *C08K 2201/001* (2013.01); *C08K 2201/005* (2013.01); *C08K 2201/011* (2013.01)

(56) References Cited

U.S. PATENT DOCUMENTS

| | | | | |
|---|---|---|---|---|
| 2010/0319900 | A1 | 12/2010 | Abyzov | |
| 2012/0107590 | A1* | 5/2012 | Xu | B22F 1/18 428/317.1 |
| 2013/0256868 | A1 | 10/2013 | Aliyev | |
| 2014/0182824 | A1* | 7/2014 | Hirotsuru | C25D 5/617 165/133 |
| 2017/0145280 | A1 | 5/2017 | Morikawa et al. | |
| 2018/0323130 | A1* | 11/2018 | Liu | H01L 23/3737 |
| 2019/0267306 | A1* | 8/2019 | Raravikar | H01L 23/42 |

FOREIGN PATENT DOCUMENTS

| | | | |
|---|---|---|---|
| CN | 101338181 | A | 1/2009 |
| CN | 102610531 | A | 7/2012 |
| CN | 104674053 | A | 6/2015 |
| CN | 105695831 | A | 6/2016 |
| CN | 105803242 | A | 7/2016 |
| CN | 104119841 | B | 6/2017 |
| CN | 104707996 | B | 6/2017 |
| CN | 106995896 | A | 8/2017 |
| CN | 107454827 | A | 12/2017 |
| CN | 107574330 | A | 1/2018 |
| CN | 106381432 | B | 5/2018 |
| CN | 108329830 | A | 7/2018 |
| CN | 108823532 | A | 11/2018 |
| CN | 108912683 | A | 11/2018 |
| CN | 109371303 | A | 2/2019 |
| JP | 2002146672 | A | 5/2002 |
| JP | 2009515362 | A | 4/2009 |
| JP | 2011074166 | A | 4/2011 |
| JP | 2018111883 | A | 7/2018 |
| WO | 2015179056 | A1 | 11/2015 |

OTHER PUBLICATIONS

H. Chen, C. Jia, S. Li, X. Jia, and X. Yang, Selective interfacial bonding and thermal conductivity of diamond/Cu-alloy composites prepared by HPHT technique, Int J Miner Metall Mater, vol. 19, No. 4, pp. 364 371, Apr. 2012.

K. Mizuuchi et al., Effect of Boron Addition on the Thermal Properties of Diamond-Particle-Dispersed Cu-Matrix Composites Fabricated by SPS, Journal of Materials Science and Chemical Engineering, vol. 04, p. 1, Sep. 2016.

* cited by examiner

HEAT CONDUCTOR, HEAT-CONDUCTING MATERIAL, AND PACKAGE STRUCTURE OF SEMICONDUCTOR DEVICE

CROSS-REFERENCE TO RELATED APPLICATIONS

This application is a continuation of International Application No. PCT/CN2020/116359, filed on Sep. 21, 2020, which claims priority to Chinese Patent Application No. 201910906873.1, filed on Sep. 24, 2019. The disclosures of the aforementioned applications are hereby incorporated by reference in their entireties.

TECHNICAL FIELD

This application relates to heat dissipation technologies, and in particular, to a heat conductor, a heat-conducting material, and a package structure of a semiconductor device.

BACKGROUND

In a package structure of a semiconductor device, the semiconductor device is usually disposed on a heat dissipation substrate by using a solder (for example, $Au_{80}Sn_{20}$) or a thermal interface material (for example, a thermally conductive adhesive). However, a coefficient of thermal conductivity of $Au_{80}Sn_{20}$ is about 57 W/mK far lower than a coefficient of thermal conductivity of a substrate of the semiconductor device (for example, a coefficient of thermal conductivity of a silicon substrate is about 150 W/mK, and a coefficient of thermal conductivity of a silicon carbide substrate is about 400 W/mK) and a coefficient of thermal conductivity of the heat dissipation substrate (for example, a coefficient of thermal conductivity of a copper substrate is about 400 W/mK). Therefore, a solder has become a major bottleneck for reducing thermal resistance of the package structure.

SUMMARY

This application provides a heat conductor. The heat conductor has a relatively large coefficient of thermal conductivity. When the heat conductor is applied to a package structure of a semiconductor device, a coefficient of thermal conductivity of the package structure can be improved. In addition, this application further provides a package structure of a semiconductor device. The foregoing heat conductor is applied to the package structure. Further, this application further provides a heat-conducting material. The foregoing heat conductor may be obtained after curing processing is performed on the heat-conducting material.

According to a first aspect, this application provides a heat conductor. The heat conductor includes a matrix, a diamond particle, and a first metal nanoparticle. The diamond particle and the first metal nanoparticle are both distributed in the matrix. An outer surface of the diamond particle is successively coated with a carbide film layer, a first metal film layer, and a second metal film layer. The carbide film layer covers the entire outer surface of the diamond particle. The first metal film layer covers an entire outer surface of the carbide film layer. The second metal film layer covers an entire outer surface of the first metal film layer in a chemical or physical deposition manner. Further, the first metal nanoparticle and an outer surface of the second metal film layer are bonded to each other by using a metallic bond.

In this application, the surface of the diamond particle is covered by the three film layers: the carbide film layer, the first metal film layer, and the second metal film layer. The three film layers are used to reduce interface thermal resistance between the diamond particle and the first metal nanoparticle.

Because diamond is phonon thermally conductive and metal is electron thermally conductive, heat conducting manners of the diamond and the metal are very different, causing a poor heat-conducting property between the diamond and the metal. In addition, because the two materials: the diamond and the metal have a relatively large feature difference, an adhesion property is also poor when direct adhesion is applied to the two materials. In this application, the carbide film layer is disposed between the diamond particle and the first metal film layer. Because carbide includes carbon and metal, a heat-conducting property and an adhesion property between the diamond particle and the first metal film layer can be enhanced.

It should be noted that the second metal film layer and the first metal nanoparticle usually use the same material because a low thermal resistance connection is more easily implemented between the same materials. The first metal film layer and the first metal nanoparticle usually use different materials. However, because the second metal film layer usually covers the surface of the first metal film layer by using the chemical or physical deposition process, thermal resistance between the first metal film layer and the second metal film layer is relatively low.

In conclusion, it may be learned that the three film layers are disposed between the diamond particle and the first metal nanoparticle, to achieve an effect of reducing the interface thermal resistance between the diamond particle and the first metal nanoparticle.

In one embodiment, a material used by the matrix may be an organic polymer.

In one embodiment, the diamond particles are evenly distributed in the matrix.

In one embodiment, the first metal nanoparticles are evenly distributed in the matrix.

In one embodiment, adjacent first metal nanoparticles are bonded to each other by using a metallic bond, so that a heat conducting path connecting two opposite surfaces of the heat conductor can be formed in the heat conductor.

In one embodiment, a second metal nanoparticle is grown on the outer surface of the second metal film layer. In this way, the first metal nanoparticle and the second metal nanoparticle that are dispersed in the matrix and that are adjacent to each other are bonded to each other by using a metallic bond, thereby forming a heat conducting path.

In one embodiment, the second metal nanoparticles are evenly grown on the outer surface of the second metal film layer.

In one embodiment, the second metal nanoparticle and the first metal nanoparticle that are adjacent to each other are bonded to each other by using a metallic bond.

With reference to any one of the foregoing implementations, in this implementation, the carbide film layer is any one of a tungsten carbide film layer, a titanium carbide film layer, a chromium carbide film layer, a molybdenum carbide film layer, a nickel carbide film layer, and a silicon carbide film layer. Because thermal resistance of these materials is relatively small, overall thermal resistance of the heat conductor can be reduced by using any one of these materials.

In one embodiment, a thickness of the carbide film layer is greater than or equal to 10 nanometers and less than or equal to 500 nanometers. By adjusting the thickness of the carbide film layer, the interface thermal resistance and an interface adhesion property of the carbide film layer can be optimized.

In one embodiment, a material used by the first metal film layer is tungsten, titanium, chromium, molybdenum, nickel, platinum, or palladium. Preparing the first metal film layer by using any one of these materials can improve the interface adhesion property between the carbide film layer and the second metal film layer.

In one embodiment, a thickness of the first metal film layer is greater than or equal to 10 nanometers and less than or equal to 500 nanometers. By adjusting the thickness of the first metal film layer, the interface thermal resistance and an interface adhesion property of the first metal film layer can be optimized.

In one embodiment, the second metal film layer includes a thin metal film layer or a plurality of thin laminated metal film layers. A material used by each thin metal film layer is copper, silver, gold, platinum, palladium, indium, bismuth, aluminum, or alumina.

Generally, the second metal film layer and the first metal nanoparticle use the same material. In this way, when a heat-conducting material is sintered to form the heat conductor, the second metal film layer and the first metal nanoparticle have a good sintering property.

In one embodiment, a thickness of the second metal film layer is greater than or equal to 0.1 micrometer and less than or equal to 10 micrometers.

In one embodiment, a material of the first metal nanoparticle is one or more of copper, silver, gold, and stannum.

In one embodiment, a particle size of the first metal nanoparticle is greater than or equal to 10 nanometers and less than or equal to 500 nanometers.

In one embodiment, a material of the second metal nanoparticle is at least one of copper, silver, or gold.

In one embodiment, a particle size of the second metal nanoparticle is greater than or equal to 10 nanometers and less than or equal to 200 nanometers.

In one embodiment, a volume ratio of the matrix in the heat conductor is less than or equal to 10%.

In one embodiment, a volume ratio of the diamond particle in the heat conductor is 0.05% to 80%. The limitation is used to improve a coefficient of thermal conductivity of the heat conductor. In addition, a Young's modulus and a coefficient of thermal expansion of the heat conductor may be adjusted by adjusting the volume ratio of the diamond particle in the heat conductor.

In one embodiment, a particle size of the diamond particle is greater than or equal to 0.01 micrometer and less than or equal to 200 micrometers. The limitation is used to improve a coefficient of thermal conductivity of the heat conductor. In addition, a Young's modulus and a coefficient of thermal expansion of the heat conductor may be adjusted by adjusting the particle size of the diamond particle in the heat conductor.

In one embodiment, the diamond particles are monocrystalline diamond particles, polycrystalline diamond particles, or both monocrystalline diamond particles and polycrystalline diamond particles.

According to a second aspect, this application provides a heat-conducting material. A difference between the heat-conducting material and the heat conductor described in any one of the foregoing implementations is that, the heat-conducting material is fluid, and the heat conductor is solid; and the foregoing heat conductor may be obtained after heat curing processing is performed on the heat-conducting material.

Specifically, the heat-conducting material includes an organic polymer, a first metal nanoparticle, and a diamond particle. The diamond particle and the first metal nanoparticle are both distributed in the organic polymer. An outer surface of the diamond particle is successively coated with three film layers: a carbide film layer, a first metal film layer, and a second metal film layer. The carbide film layer covers the entire outer surface of the diamond particle. The first metal film layer covers an entire outer surface of the carbide film layer. The second metal film layer covers an entire outer surface of the first metal film layer. It should be noted that the first metal nanoparticle and an outer surface of the second metal film layer are bonded to each other by using a metallic bond.

For beneficial effects of the heat-conducting material, refer to the foregoing beneficial effects of the heat conductor. Details are not described herein again.

In one embodiment, adjacent first metal nanoparticles are bonded to each other by using a metallic bond, to form a heat conducting path.

In one embodiment, the heat-conducting material further includes a second metal nanoparticle grown on the outer surface of the second metal film layer, to form a heat conducting path.

In one embodiment, the first metal nanoparticle and the second metal nanoparticle that are adjacent to each other are bonded to each other by using a metallic bond, to form a heat conducting path.

According to a third aspect, this application further provides a package structure of a semiconductor device. The package structure includes a semiconductor device, a heat dissipation substrate, and the heat conductor according to the first aspect or any one of implementations of the first aspect. The heat conductor is located between the semiconductor device and the heat dissipation substrate. One surface of the heat conductor faces a back of the semiconductor device and is in contact with the back of the semiconductor device, and the other surface of the heat conductor faces a surface that is of the heat dissipation substrate and that is used for disposing a device and is in contact with the surface used for disposing the device.

Because the heat conductor has a relatively good heat-conducting property, in the package structure, heat generated by the semiconductor device can be transferred to the heat dissipation substrate in time, and is transferred out by using the heat dissipation substrate.

In one embodiment a back metal layer is disposed on the back of the semiconductor device. The back metal layer is a thin metal film layer or a plurality of thin laminated metal film layers. A material used by each thin metal film layer is titanium (Ti), platinum (Pt), palladium (Pd), aluminum (Al), nickel (Ni), copper (Cu), silver (Ag), or gold (Au).

The back metal layer is added to the back of the semiconductor device, to further improve a capability of transferring heat from the semiconductor device to the heat conductor.

In one embodiment, surfaces that are of the back metal layer and the heat conductor and that face each other are bonded to each other by using a metallic bond, to further improve a capability of transferring heat from the semiconductor device to the heat conductor. In one embodiment, surfaces that are of the heat conductor and the heat dissipation substrate and that face each other are bonded to each other by using a metallic bond, to further improve a capability of transferring heat from the heat conductor to the heat dissipation substrate.

DESCRIPTION OF EMBODIMENTS

Figure 1:
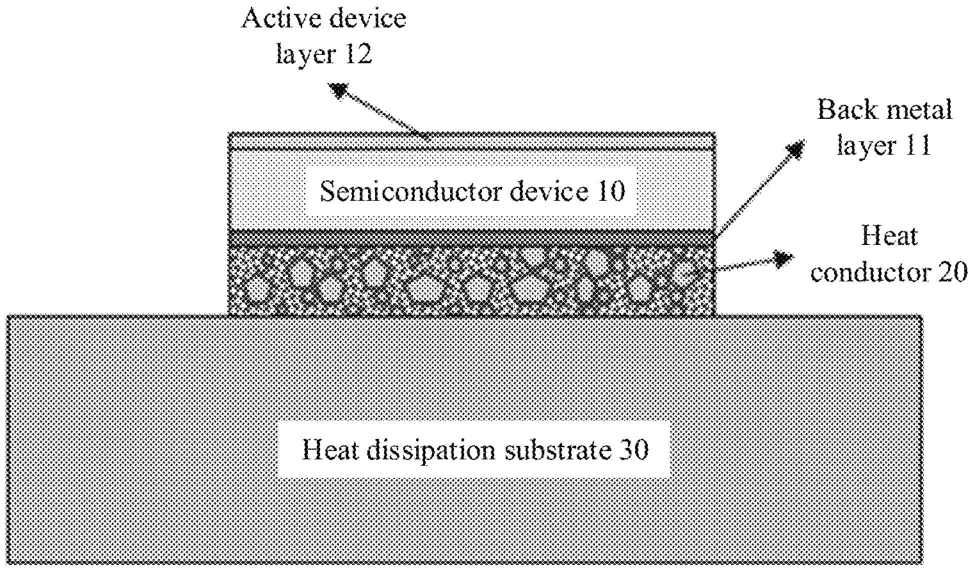
FIG. 1 is a schematic diagram of a package structure of a semiconductor device according to this application.

FIG. 1 is a schematic diagram of a package structure of a semiconductor device according to this application. Specifically, the package structure includes a semiconductor device 10, a heat conductor 20, and a heat dissipation substrate 30. The semiconductor device 10 is disposed on the heat dissipation substrate 30, and the heat conductor 20 is located between the semiconductor device 10 and the heat dissipation substrate 30. A surface that is of the semiconductor device 10 and that faces the heat dissipation substrate 30 is a back of the semiconductor device 10. A surface that is of the heat dissipation substrate 30 and that is used for setting (or fastening) the semiconductor device 10 may be referred to as a fastening surface of the heat dissipation substrate 30. Therefore, one surface of the heat conductor 20 is in contact with the back of the semiconductor device 10, and the other surface of the heat conductor 20 is in contact with the fastening surface of the heat dissipation substrate 30. It should be learned that one surface of the heat conductor 20 is opposite to the other surface of the heat conductor 20.

In one embodiment, one surface of the heat conductor 20 has the same shape and the same size as the back of the semiconductor device 10, and one surface of the heat conductor 20 is aligned with an edge of the back of the semiconductor device 10.

In this application, the heat conductor 20 is not only configured to import heat generated by the semiconductor device 10 into the heat dissipation substrate 30 (or configured to form a heat conducting path between the semiconductor device 10 and the heat dissipation substrate 30), but also configured to form a mechanical connection between the semiconductor device 10 and the heat dissipation substrate 30.

In one embodiment, the heat conductor 20 may be formed after heat curing processing is performed on a heat-conducting material (sometimes referred to as a "heat-conducting solder") that is filled between the back of the semiconductor device 10 and the fastening surface of the heat dissipation substrate 30. In this case, for the heat-conducting material, refer to related descriptions of subsequent embodiments of the heat-conducting material provided in this application. Details are not described herein.

It should be noted that, when the heat conductor 20 is obtained after the heat curing processing is performed on the heat-conducting material filled between the back of the semiconductor device 10 and the fastening surface of the heat dissipation substrate 30, the heat curing processing may be sintering processing performed at a temperature not higher than 300° C.

For the package structure provided in this application, in another embodiment, the back of the semiconductor device 10 and one surface of the heat conductor 20 are bonded to each other by using a metallic bond, and In one embodiment, the other surface of the heat conductor 20 and the fastening surface of the heat dissipation substrate 30 are bonded to each other by using a metallic bond.

It should be noted that, when the sintering processing is performed on the heat-conducting material at the temperature not higher than 300° C., a metal particle located on the back of the semiconductor device 10 and a metal nanoparticle located at one surface of the heat conductor 20 may be bonded to each other by using a metallic bond.

Similarly, when the sintering processing is performed on the heat-conducting material at the temperature not higher than 300° C., a metal particle located at the fastening surface of the heat dissipation substrate 30 and a metal nanoparticle located at the other surface of the heat conductor 20 may be bonded to each other by using a metallic bond.

It should be noted that the metal nanoparticle located at one surface of the heat conductor 20 is generally a first metal nanoparticle, or may be a second metal nanoparticle. For a difference between the first metal nanoparticle and the second metal nanoparticle, refer to descriptions in the following embodiment.

In one embodiment, the heat conductor 20 is a thermally conductive pad. The thermally conductive pad is disposed between the surface of the semiconductor device 10 and the fastening surface of the heat dissipation substrate 30. It should be learned that the thermally conductive pad may be alternatively obtained after curing processing is performed on the heat-conducting material in advance. Specifically, the thermally conductive pad may be obtained after curing (or pre-forming) processing is performed on the heat-conducting material at a temperature not higher than 300° C.

In this embodiment, a back metal layer 11 may be disposed at the back of the semiconductor device 10. The back metal layer 11 indicates one or more thin metal film layers plated at the back (or a bottom) of the semiconductor device 10. It should be noted that a material used by each thin metal film layer included in the back metal layer 11 is titanium (Ti), platinum (Pt), palladium (Pd), aluminum (Al), nickel (Ni), copper (Cu), silver (Ag), or gold (Au). When the back metal layer 11 includes a plurality of thin laminated metal film layers, materials used by each two adjacent metal films are different. In one embodiment, materials separately used by the plurality of thin metal film layers included in the back metal layer 11 are different.

When the back metal layer 11 is disposed at the back of the semiconductor device 10, that "the back of the semiconductor device 10 and one surface of the heat conductor 20 are bonded to each other by using a metallic bond" specifically indicates that a surface that is of the back metal layer 11 and that faces the surface of the heat conductor is bonded to the surface of the heat conductor by using the metallic bond.

A substrate of the semiconductor device 10 described in this application is a silicon substrate, a silicon carbide substrate, a gallium nitride substrate, a monocrystalline diamond substrate, or a polycrystalline diamond substrate.

In one embodiment, the semiconductor device 10 includes an active device layer 12. The active device layer 12 is located at a front of the semiconductor device 10 (the "back of the semiconductor device 10" has been defined above, and the front of the semiconductor device 10 indicates a surface that is opposite to the back of the semiconductor device 10). The active device layer 12 may be specifically a silicon device layer or a wide bandgap semiconductor device layer. The active device layer 12 may be silicon carbide, gallium nitride, or gallium oxide.

In one embodiment, the semiconductor device 10 is a chip.

In another embodiment of this application, a heat sink may be further disposed at the back of the heat dissipation substrate 30. The heat sink is configured to transfer heat out from the heat dissipation substrate 30. The back of the heat dissipation substrate 30 is opposite to the fastening surface of the heat dissipation substrate 30. The heat sink may be specifically a heat sink fin. Further, the heat sink may be fastened to the back of the heat dissipation substrate 30 by using a heat-conducting material, a heat conductor, or a thermal interface material (TIM). The heat-conducting material (or the heat conductor) may be the heat-conducting material (or the heat conductor) provided in the following embodiment of this application, or may be another heat-conducting material (or another heat conductor).

In one embodiment, the heat dissipation substrate 30 may be a metal substrate, a diamond substrate, a copper-covered ceramic substrate, a silicon carbide substrate, or an aluminum nitride substrate. The heat dissipation substrate 30 may further be a substrate made of a composite material including diamond and metal.

In one embodiment, the heat dissipation substrate 30 may be metal (that is, a metal substrate), or may be a substrate coated with a surface metal layer, and a material of the surface metal layer is one or more of copper, nickel, silver, or gold.

This application further provides the heat conductor. The heat conductor 20 may be applied to the foregoing package structure, and is configured to: transfer heat generated by the semiconductor device 10 to the heat dissipation substrate 30, and transfer the heat out by using the heat dissipation substrate 30.

Figure 2:
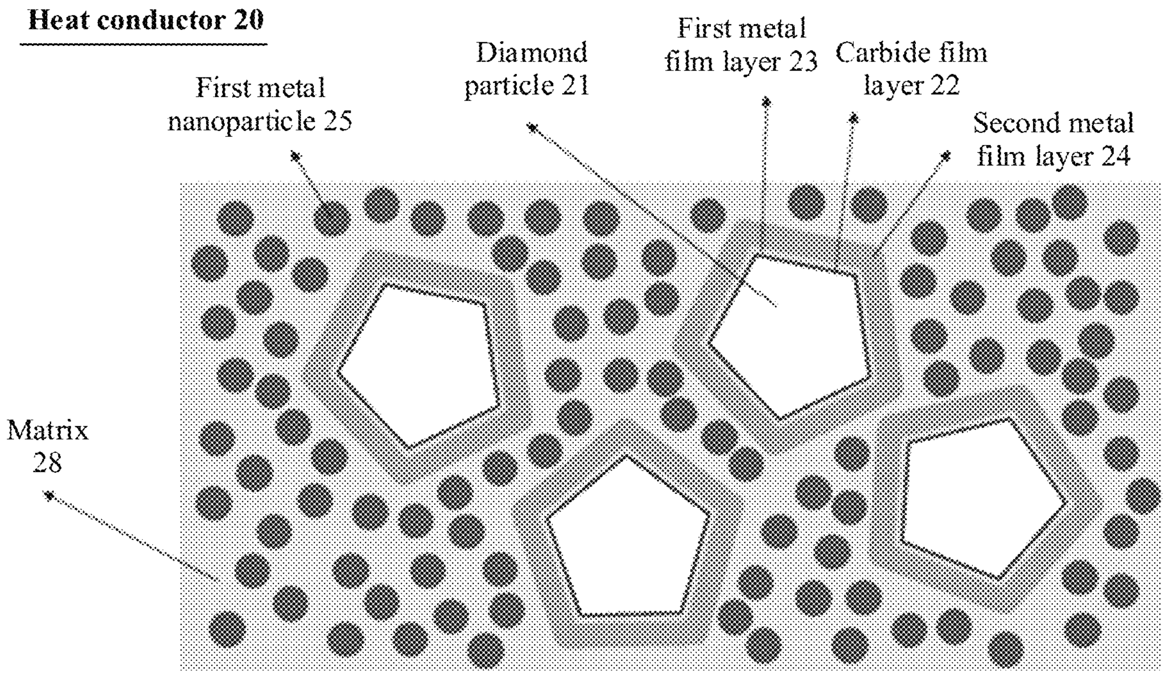
FIG. 2 to FIG. 4 are schematic diagrams of a heat conductor according to this application.

FIG. 2 is a schematic diagram of a heat conductor 20 according to this application. Specifically, the heat conductor 20 includes a matrix 28, diamond particles 21, and first metal nanoparticles 25. The diamond particles 21 and the first metal nanoparticles 25 are evenly distributed in the matrix 28. It should be noted that an outer surface of the diamond particle 21 is successively coated with a carbide film layer 22, a first metal film layer 23, and a second metal film layer 24. The carbide film layer 22 is in contact with the outer surface of the diamond particle 21, and covers the entire outer surface of the diamond particle 21. The first metal film layer 23 is located between the carbide film layer 22 and the second metal film layer 24, and covers an entire outer surface of the carbide film layer 22. The second metal film layer 24 is located at an outer surface of the first metal film layer 23, and covers the entire outer surface of the first metal film layer 23.

It should be noted that a purpose of successively coating the outer surface of the diamond particle 21 by using a plurality of film layers is to reduce surface thermal resistance of the diamond particle 21. Therefore, "coating (or wrapping) an entire outer surface" in this application may be coating (or wrapping) the entire outer surface, or may be almost coating (or wrapping) the entire outer surface, for example, coating (or wrapping) 95% or more of the outer surface. It should be learned that "coating (or wrapping) the entire outer surface" in this application is limited by a technical level, and therefore, may be actually not covering (or wrapping) all of the outer surface. Specifically, in this application, understanding of "coating (or wrapping) the entire outer surface" shall be based on understanding of a person skilled in the art and based on whether inventive objects of this embodiment can be achieved.

The matrix 28 may be an organic polymer. The diamond particles 21 and the first metal nanoparticles 25 may be evenly distributed in the organic polymer.

In one embodiment, a particle size (that is, a diameter) of the diamond particle 21 is at a micrometer level. The particle size of the diamond particle 21 may be greater than or equal to 0.01 micrometer and less than or equal to 200 micrometers. For example, an average particle size of the diamond particles 21 is 5 micrometers. Because a shape of the diamond particle 21 is not spherical, the particle size of the diamond particle 21 may be understood as the average particle size of the diamond particles 21. In addition, when a "particle size of a particle" is mentioned elsewhere in this application, it should also be understood as an average particle size of the particles.

Further, in this embodiment, the diamond particles 21 may be all diamond particles with particle sizes at the micrometer level, or may include both diamond particles with particle diameters at the micrometer level and diamond particles with particle sizes at a nanometer level. Because the diamond particle at the nanometer level is relatively small, a surface area of the diamond particle is also relatively small. If a plurality of diamond particles at the micrometer level have the same volume as a plurality of diamond particles at the nanometer level, because a total surface area of the plurality of diamond particles at the nanometer level is relatively large, interface thermal resistance is also relatively large, causing a relatively poor heat conducting effect.

In one embodiment, the diamond particles 21 may be monocrystalline diamond particles, polycrystalline diamond particles, or both monocrystalline diamond particles and polycrystalline diamond particles.

In one embodiment, in the heat conductor 20, a volume ratio of the diamond particle 21 is greater than or equal to 0.05% and less than or equal to 80%, or a volume ratio of the diamond particle 21 is greater than or equal to 5% and less than or equal to 80%, or a volume ratio of the diamond particle is greater than or equal to 10% and less than or equal to 80%.

It should be noted that a volume ratio of the matrix 28 in the heat conductor provided in this application may be less than or equal to 10%. Further, the volume ratio of the matrix 28 may be less than or equal to 1%.

It should be noted that, in this embodiment, the carbide film layer 22 is a tungsten carbide (WC or $W_2C$) film layer, a titanium carbide (TiC) film layer, a chromium carbide ($Cr_3C_2$, $Cr_3C_7$, or $Cr_{23}C_7$) film layer, a molybdenum carbide (MoC or $Mo_2C$) film layer, a nickel carbide ($Ni_3C$) film layer, or a silicon carbide (SiC) film layer. Specifically, when the carbide film layer 22 is the tungsten carbide film layer, a material of the tungsten carbide film layer may be tungsten carbide (WC), may be ditungsten carbide ($W_2C$), or may include both tungsten carbide (WC) and ditungsten carbide ($W_2C$). When the carbide film layer 22 is the chromium carbide film layer, a material of the chromium carbide film layer is one or more of $Cr_3C_2$ ($Cr_3C_2$), $Cr_3C_7$ ($Cr_3C_7$), or $Cr_{23}C_7$ ($Cr_{23}C_7$). When the carbide film layer 22 is the molybdenum carbide film layer, a material used by the molybdenum carbide film layer may be molybdenum carbide (MoC), may be dimolybdenum carbide ($Mo_2C$), or may include both molybdenum carbide (MoC) and dimolybdenum carbide ($Mo_2C$). In addition, in this embodiment, a thickness of the carbide film layer 22 is greater than or equal to 10 nanometers and less than or equal to 500 nanometers.

It should be noted that a material used by the first metal film layer 23 is tungsten (W), titanium (Ti), chromium (Cr), molybdenum (Mo), nickel (Ni), platinum (Pt), or palladium (Pd). Further, a thickness of the first metal film layer 23 is greater than or equal to 10 nanometers and less than or equal to 500 nanometers.

It should be noted that the second metal film layer 24 includes a thin metal film layer or a plurality of thin laminated metal film layers. A material used by each thin metal film layer is copper (Cu), silver (Ag), gold (Au), platinum (Pt), palladium (Pd), indium (In), bismuth (Bi), aluminum (Al), alumina, and the like. When the second metal film layer 24 includes the plurality of thin laminated metal film layers, materials used by each two adjacent metal films in the plurality of thin metal film layers are different. In one embodiment, materials separately used by the plurality of thin metal film layers included in the second metal film layer 24 are different. A thickness of the second metal film layer 24 is greater than or equal to 0.1 micrometer and less than or equal to 10 micrometers. For example, the thickness of the second metal film layer 24 may 1 micrometer.

It should be noted that a material used by the first metal nanoparticle 25 in this embodiment is one or more of copper (Cu), silver (Ag), gold (Au), and stannum (Sn). Specifically, the first metal nanoparticle 25 may be one or more of the following metal particles: a copper particle, a silver particle, a gold particle, a stannum particle, and silver-coated copper, and a particle of an alloy formed by any two or three of copper, silver, gold, and stannum. It should be noted that "a plurality of" means more than two in this application. The "silver-coated copper" indicates coating a silver layer on the outside of a copper ball. The "particle of an alloy formed by any two or three of copper, silver, gold, and stannum" may be, for example, a copper-silver alloy particle, a silver-copper alloy particle, a copper-gold alloy particle, a gold-copper alloy particle, a copper-stannum alloy particle, a stannum-copper alloy particle, or a copper-silver-stannum alloy particle. In one embodiment, a particle size of the first metal nanoparticle 25 is greater than or equal to 10 nanometers and less than or equal to 500 nanometers. For example, the first metal nanoparticle 25 is a silver particle with an average particle size of 30 nanometers.

Figure 3:
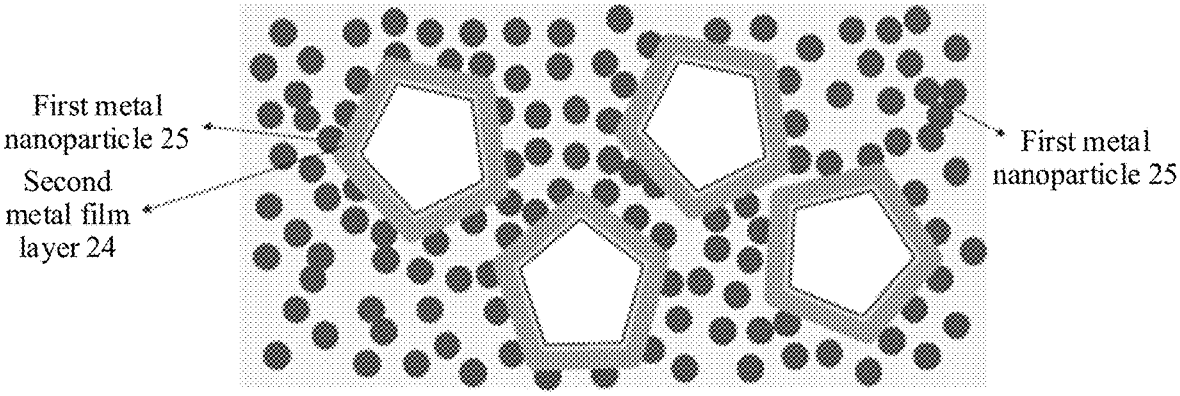

It should be noted that, as shown in FIG. 3, some of the first metal nanoparticles 25 are bonded to an outer surface of the second metal film layer 24 by using metallic bonds. More precisely, some of the first metal nanoparticles 25 are bonded to metal ions at the outer surface of the second metal film layer 24 by using the metallic bonds. Correspondingly, the adjacent first metal nanoparticles 25 may also be bonded to each other by using a metallic bond.

Figure 4:
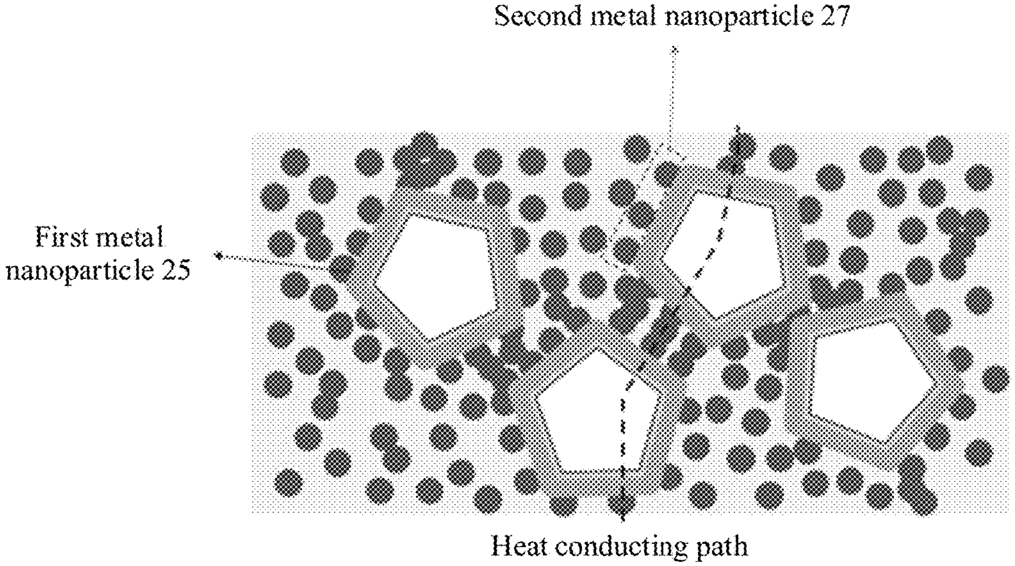

To reduce surface thermal resistance of the outer surface of the second metal film layer 24, in another embodiment, as shown in FIG. 4, a second metal nanoparticle 27 may further be grown on the outer surface of the second metal film layer 24. It can be learned from this that a difference between the second metal nanoparticle 27 and the first metal nanoparticle 25 is that the second metal nanoparticle 27 is grown on the outer surface of the second metal film layer 24, and the first metal nanoparticle 25 is bonded to the metal ion at the outer surface of the second metal film layer 24 by using the metallic bond. The second metal nanoparticle 27 is at least one of a gold particle, a silver particle, or a copper particle. In this embodiment, the second metal nanoparticle 27 and the first metal nanoparticle 25 that are adjacent to each other may be bonded to each other by using a metallic bond. It should be further noted that a particle size of the second metal nanoparticle 27 is greater than or equal to 10 nanometers and less than or equal to 200 nanometers. In one embodiment, the second metal nanoparticles 27 are evenly grown on the outer surface of the second metal film layer 24.

With reference to FIG. 4, the first metal nanoparticle 25 and the diamond particle 21; or the first metal nanoparticle 25, the second metal nanoparticle 27, and the diamond particle 21 form a heat conducting path passing one surface of the heat conductor 20 to the other surface.

It should be noted that, the metallic bond between the first metal nanoparticle 25 and the outer surface of the second metal film layer 24, the metallic bond between the adjacent first metal nanoparticles 25, or the metallic bond between the second metal nanoparticle 27 and the first metal nanoparticle 25 may be all implemented through sintering processing is performed on a material for forming the metallic bond at a temperature not higher than 300° C. For example, the second metal nanoparticle 27 and the first metal nanoparticle 25 are sintered at the temperature not higher than 300° C. In this way, the metallic bond may be formed between the second metal nanoparticle 27 and the first metal nanoparticle 25 that are adjacent to each other.

To implement the coefficient of thermal conductivity of the heat conductor provided in this application, in another embodiment, one or more of a multi-walled carbon nanotube, a single-walled carbon nanotube, or graphene may be evenly mixed in the matrix 28.

This application further provides a heat-conducting material. The heat-conducting material includes an organic polymer, a first metal nanoparticle, and a diamond particle. The diamond particles and the first metal nanoparticles are evenly distributed in the organic polymer. An outer surface of the diamond particle is successively coated with a carbide film layer, a first metal film layer, and a second metal film layer. It should be noted that the embodiment about the heat-conducting material and the foregoing embodiment about the heat conductor have many same parts (for the same parts, reference may be made to the foregoing embodiment about the heat conductor, and details are not described herein again). A difference between the two embodiments is that the organic polymer is fluid, and therefore, the heat-conducting material is also fluid. The heat conductor described in the foregoing embodiment may be obtained after the heat-conducting material is heated and sintered. It should be learned that the foregoing heat conductor is solid. For example, the heat conductor described in the foregoing embodiment may be formed after the heat-conducting material is heated and sintered at a temperature not higher than 300° C. Therefore, it is easily learned that a volume ratio of the organic polymer in the heat-conducting material is greater than a volume ratio of the organic polymer in the heat conductor.

It should be noted that the foregoing descriptions are merely specific implementations of the embodiments of the present disclosure, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims. In addition, mutual reference may be made to the foregoing embodiments.

What is claimed is:

1. A heat conductor, comprising:

a matrix, wherein one or more of a multi-walled carbon nanotube, a single-walled carbon nanotube, or graphene is evenly mixed in the matrix;

a diamond particle and a plurality of first metal nanoparticles that are distributed in the matrix, wherein an outer surface of the diamond particle is successively coated with a carbide film layer, a first metal film layer, and a second metal film layer; the carbide film layer covers an entire outer surface of the diamond particle; the first metal film layer covers an entire outer surface of the carbide film layer; the second metal film layer covers an entire outer surface of the first metal film layer in a chemical or physical deposition manner; wherein a first metal nanoparticle of the plurality of first metal nanoparticles and metal ions at an outer surface of the second metal film layer are bonded to each other by using a metallic bond formed by sintering at a temperature not higher than 300° C., and wherein the carbide film layer is disposed in contact with the diamond particle and disposed between the diamond particle and the first metal film layer, a material of the first metal film layer is different than a material of the first metal nanoparticle, and a material of the second metal film layer is same as the material of the first metal nanoparticle; and a plurality of second metal nanoparticles evenly grown on the outer surface of the second metal film layer.

2. The heat conductor according to claim 1, wherein adjacent first metal nanoparticles are bonded to each other by using a metallic bond.

3. The heat conductor according to claim 1, wherein a first metal nanoparticle of the plurality of first metal nanoparticles and a second metal nanoparticle of the plurality of second metal nanoparticles that are adjacent to each other are bonded to each other by using a metallic bond.

4. The heat conductor according to claim 1, wherein the carbide film layer is one of a tungsten carbide film layer, a titanium carbide film layer, a chromium carbide film layer, a molybdenum carbide film layer, a nickel carbide film layer, or a silicon carbide film layer.

5. The heat conductor according to claim 1, wherein a thickness of the carbide film layer is greater than or equal to 10 nanometers and less than or equal to 500 nanometers.

6. The heat conductor according to claim 1, wherein a material used by the first metal film layer is tungsten, titanium, chromium, molybdenum, nickel, platinum, or palladium.

7. The heat conductor according to claim 1, wherein a thickness of the first metal film layer is greater than or equal to 10 nanometers and less than or equal to 500 nanometers.

8. The heat conductor according to claim 1, wherein the second metal film layer comprises one or more thin metal film layers, and a material used by each thin metal film layer of the one or more thin metal film layers is copper, silver, gold, platinum, palladium, indium, bismuth, aluminum, or alumina.

9. The heat conductor according to claim 1, wherein a thickness of the second metal film layer is greater than or equal to 0.1 micrometer and less than or equal to 10 micrometers.

10. The heat conductor according to claim 1, wherein a material of the plurality of first metal nanoparticles is one or more of copper, silver, gold, or stannum.

11. The heat conductor according to claim 1, wherein a volume ratio of the matrix in the heat conductor is less than or equal to 10%.

12. The heat conductor according to claim 1, wherein a volume ratio of the diamond particle in the heat conductor is 0.05% to 80%.

13. The heat conductor according to claim 1, wherein a particle size of the diamond particle is greater than or equal to 0.01 micrometer and less than or equal to 200 micrometers.

14. A heat-conducting material, comprising an organic polymer, wherein one or more of a multi-walled carbon nanotube, a single-walled carbon nanotube, or graphene is evenly mixed in the organic polymer;

a diamond particle and a plurality of first metal nanoparticles that are distributed in the organic polymer, wherein an outer surface of the diamond particle is successively coated with a carbide film layer, a first metal film layer, and a second metal film layer; the carbide film layer covers an entire outer surface of the diamond particle; the first metal film layer covers an entire outer surface of the carbide film layer; the second metal film layer covers an entire outer surface of the first metal film layer; wherein a first metal nanoparticle of the plurality of first metal nanoparticles and metal ions at an outer surface of the second metal film layer are bonded to each other by using a metallic bond formed by sintering at a temperature not higher than 300° C., and wherein the carbide film layer is disposed in contact with the diamond particle and disposed between the diamond particle and the first metal film layer, a material of the first metal film layer is different than a material of the first metal nanoparticle, and a material of the second metal film layer is same as the material of the first metal nanoparticle; and a plurality of second metal nanoparticles evenly grown on the outer surface of the second metal film layer.

15. The heat-conducting material according to claim 14, wherein adjacent first metal nanoparticles are bonded to each other by using a metallic bond.

16. The heat-conducting material according to claim 14, wherein a first metal nanoparticle of the plurality of first metal nanoparticles and a second metal nanoparticle of the plurality of second metal nanoparticles that are adjacent to each other are bonded to each other by using a metallic bond.

17. A package structure of a semiconductor device, comprising a semiconductor device, a heat dissipation substrate, and a heat conductor comprising a matrix, wherein one or more of a multi-walled carbon nanotube, a single-walled carbon nanotube, or graphene is evenly mixed in the matrix;

a diamond particle and a plurality of first metal nanoparticles that are distributed in the matrix, wherein an outer surface of the diamond particle is successively coated with a carbide film layer, a first metal film layer, and a second metal film layer; the carbide film layer covers an entire outer surface of the diamond particle; the first metal film layer covers an entire outer surface of the carbide film layer; the second metal film layer covers an entire outer surface of the first metal film layer in a chemical or physical deposition manner; wherein a first metal nanoparticle of the plurality of first metal nanoparticles and metal ions at an outer surface of the second metal film layer are bonded to each other by using a metallic bond formed by sintering at a temperature not higher than 300° C., and wherein the carbide film layer is disposed in contact with the diamond particle and disposed between the diamond particle and the first metal film layer, a material of the first metal film layer is different than a material of the first metal nanoparticle, and a material of the second metal film layer is same as the material of the first metal nanoparticle; and a plurality of second metal nanoparticles evenly grown on the outer surface of the second metal film layer, wherein the heat conductor is located between the semiconductor device and the heat dissipation substrate; and a first surface of the heat conductor faces a back of the semiconductor device and is in contact with the back of the semiconductor device, and a second surface of the heat conductor faces a fastening surface of the heat dissipation substrate and is in contact with the fastening surface of the heat dissipation substrate.

18. The package structure according to claim 17, wherein a back metal layer is disposed on the back of the semiconductor device, the back metal layer is one or more thin metal film layers, and a material used by each thin metal film layer of the one or more thin metal film layers is titanium, platinum, palladium, aluminum, nickel, copper, silver, or gold.

19. The package structure according to claim 17, wherein adjacent first metal nanoparticles are bonded to each other by using a metallic bond.

20. The package structure according to claim 17, wherein a first metal nanoparticle of the plurality of first metal nanoparticles and a second metal nanoparticle of the plurality of second metal nanoparticles that are adjacent to each other are bonded to each other by using a metallic bond.

* * * * *